US011569134B2

(12) United States Patent
Jain et al.

(10) Patent No.: US 11,569,134 B2
(45) Date of Patent: Jan. 31, 2023

(54) WAFER BACKSIDE ENGINEERING FOR WAFER STRESS CONTROL

(71) Applicant: International Business Machines Corporation, Armonk, NY (US)

(72) Inventors: Nikhil Jain, Albany, NY (US); Hsueh-Chung Chen, Cohoes, NY (US); Mary Claire Silvestre, Clifton Park, NY (US); Hosadurga Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 332 days.

(21) Appl. No.: 16/847,811

(22) Filed: Apr. 14, 2020

(65) Prior Publication Data

US 2021/0320036 A1 Oct. 14, 2021

(51) Int. Cl.
*H01L 21/66* (2006.01)
*G01N 21/956* (2006.01)
(Continued)

(52) U.S. Cl.
CPC .............. *H01L 22/12* (2013.01); *G01B 11/16* (2013.01); *G01B 11/306* (2013.01); *G01N 21/9501* (2013.01); *G01N 21/95607* (2013.01); *G01B 11/255* (2013.01); *G03F 7/70783* (2013.01); *H01L 21/67288* (2013.01)

(58) Field of Classification Search
CPC ................ H01L 23/562; H01L 21/302; H01L 21/67288; H01L 22/12; G01B 11/16; G01B 11/306; G01B 11/255; G01N 21/9501; G01N 21/95607; G03F 7/70783
See application file for complete search history.

(56) References Cited

U.S. PATENT DOCUMENTS 6,429,151 B1 * 8/2002 Moore .............. H01L 21/02271
257/E21.258
6,713,366 B2 3/2004 Mong et al.
(Continued)

OTHER PUBLICATIONS

S. Irving et al., Wafer Deposition/Metallization and Back Grind, Process-Induced Warpage Simulation:, Proceedings—Electronic Components and Technology Conference Feb. 2003.
(Continued)

*Primary Examiner* — Gordon J Stock, Jr.
(74) *Attorney, Agent, or Firm* — Fleit Intellectual Property Law; Thomas S. Grzesik

(57) ABSTRACT

A semiconductor structure and a method for managing semiconductor wafer stress are disclosed. The semiconductor structure includes a semiconductor wafer, a first stress layer disposed on and in contact with a backside of the semiconductor wafer, and a second stress layer on and in contact with the first stress layer. The first stress layer exerts a first stress on the semiconductor wafer and the second layer exerts a second stress on the semiconductor wafer that is opposite the first backside stress. The method includes forming a first stress layer on and in contact with a backside of a semiconductor wafer, and further forming a second stress layer on and in contact with the first stress layer. The first stress layer exerts a first stress on the semiconductor wafer and the second stress layer exerts a second stress on the semiconductor wafer that is opposite to the first stress.

15 Claims, 9 Drawing Sheets

(51) Int. Cl.
*G01B 11/30* (2006.01)
*G01N 21/95* (2006.01)
*G01B 11/16* (2006.01)
*H01L 21/67* (2006.01)
*G03F 7/20* (2006.01)
*G01B 11/255* (2006.01)

(56) References Cited

U.S. PATENT DOCUMENTS

| | | | |
|---|---|---|---|
| 6,762,846 B1* | 7/2004 | Poris | G01B 11/24 |
| | | | 356/601 |
| 7,247,556 B2 | 7/2007 | Nanda et al. | |
| 7,696,108 B2 | 4/2010 | Wang et al. | |
| 7,957,827 B2* | 6/2011 | Shih | H01L 22/12 |
| | | | 700/121 |
| 8,900,969 B2* | 12/2014 | Shen | H01L 27/02 |
| | | | 257/178 |
| 8,927,334 B2 | 1/2015 | Daubenspeck et al. | |
| 8,987,050 B1 | 3/2015 | Hiner et al. | |
| 9,048,298 B1 | 6/2015 | Huemoeller et al. | |
| 9,184,041 B2 | 11/2015 | Chen et al. | |
| 9,236,311 B2* | 1/2016 | Chen | H01L 21/76898 |
| 9,355,967 B2* | 5/2016 | Kim | G06F 30/398 |
| 9,997,348 B2 | 6/2018 | Brunner et al. | |
| 2004/0241946 A1 | 12/2004 | Kim et al. | |
| 2007/0267724 A1* | 11/2007 | Jeng | H01L 21/78 |
| | | | 257/632 |
| 2010/0314725 A1 | 12/2010 | Gu et al. | |
| 2014/0145324 A1* | 5/2014 | Uchibori | H01L 22/12 |
| | | | 257/737 |
| 2015/0044783 A1* | 2/2015 | Carswell | H01L 21/30625 |
| | | | 438/692 |
| 2015/0155242 A1* | 6/2015 | Li | H01L 21/0223 |
| | | | 438/455 |
| 2015/0294917 A1* | 10/2015 | deVilliers | H01L 21/265 |
| | | | 438/7 |
| 2015/0323313 A1* | 11/2015 | Aiyer | G01B 11/2441 |
| | | | 356/503 |
| 2015/0380334 A1 | 12/2015 | Hu et al. | |
| 2017/0162522 A1* | 6/2017 | Chang | H01L 21/02183 |
| 2018/0067403 A1* | 3/2018 | deVilliers | G06F 30/23 |
| 2019/0385935 A1* | 12/2019 | Gao | H01L 24/80 |
| 2019/0385954 A1* | 12/2019 | Rondon | H01L 23/562 |
| 2020/0058486 A1* | 2/2020 | Dai | H01L 21/02274 |
| 2020/0251443 A1* | 8/2020 | Kanakamedala | H01L 24/94 |
| 2021/0020435 A1* | 1/2021 | Fulford | H01L 21/02304 |

OTHER PUBLICATIONS

Byung-Wook Nam et al. "Investigation of Wafer Warpage Induced by Multi-layer Films" Journal of Semiconductor Technology and Science, vol. 18, No. 1 Feb. 2018.

* cited by examiner

WAFER BACKSIDE ENGINEERING FOR WAFER STRESS CONTROL

BACKGROUND OF THE INVENTION

The present disclosure generally relates to the field of semiconductors, and more particularly relates to managing semiconductor wafer stress and topography.

In the field of semiconductor wafer fabrication, structures and layers deposited on a wafer impart stress onto the underlying substrate. As industry demands increase for lighter and thinner semiconductor wafers, these wafers are more susceptible to relatively significant distortions in wafer topography upon application of such stressors. As critical dimensions continue to decrease, issues such as topography and overlay errors become more significant in semiconductor wafer manufacturing. Wafers that are distorted due to wafer bowing can interfere with downstream processes, such as chemical mechanical planarization (CMP) or subsequent lithography steps, and can result in systematic with-die variability and yield loss. In addition, severely bowed wafers can crack and cause a significant cost penalty in equipment maintenance.

SUMMARY OF THE INVENTION

In one embodiment, a method for managing semiconductor wafer stress includes forming a first stress layer on and in contact with a backside of a semiconductor wafer, and further forming a second stress layer on and in contact with the first stress layer. The first stress layer exerts a first stress on the semiconductor wafer and the second stress layer exerts a second stress on the semiconductor wafer that is of an opposite nature to the first stress, where the first stress and the second stress form a backside stress on the semiconductor wafer. The backside of the semiconductor wafer is opposite to a front side of the semiconductor wafer on which semiconductor device features are fabricated.

In another embodiment, a method for managing semiconductor wafer stress includes forming a first stress layer on and in contact with a backside of a semiconductor wafer, and further forming a second stress layer on and in contact with the first stress layer. The first stress layer exerts a first stress on the semiconductor wafer and the second stress layer exerts a second stress on the semiconductor wafer that is of an opposite nature to the first stress. One or more features are formed on a front side of the semiconductor wafer. A front side stress exerted on the semiconductor wafer by the one or more features is determined. The front side stress is compared to a stress threshold. In response to the front side stress satisfying the stress threshold, the front side stress is counteracted by at least one of removing or thinning a portion of at least the second stress layer. In response to the front side stress failing to satisfy the stress threshold, the first stress layer and the second stress layer are maintained in their current state.

In a further embodiment, a semiconductor structure comprises a semiconductor wafer, a first stress layer disposed on and in contact with a backside of the semiconductor wafer, and a second stress layer on and in contact with the first stress layer. The first stress layer exerts a first stress on the semiconductor wafer and the seconds stress layer exerts a second stress on the semiconductor wafer that is of an opposite nature the first stress. The first stress and the second stress form a backside stress on the semiconductor wafer, where the backside is opposite to a front side of the semiconductor wafer on which semiconductor device features are fabricated.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

As required, detailed embodiments are discussed herein. However, it is to be understood that the provided embodiments are merely examples and that the systems and methods described below can be embodied in various forms.

Therefore, specific structural and functional details discussed herein are not to be interpreted as limiting, but merely as a basis for the claims and as a representative basis for teaching one skilled in the art to variously employ the present subject matter in virtually any appropriately detailed structure and function. Further, the terms and phrases used herein are not intended to be limiting, but rather, to provide an understandable description of the concepts.

Figure 1:
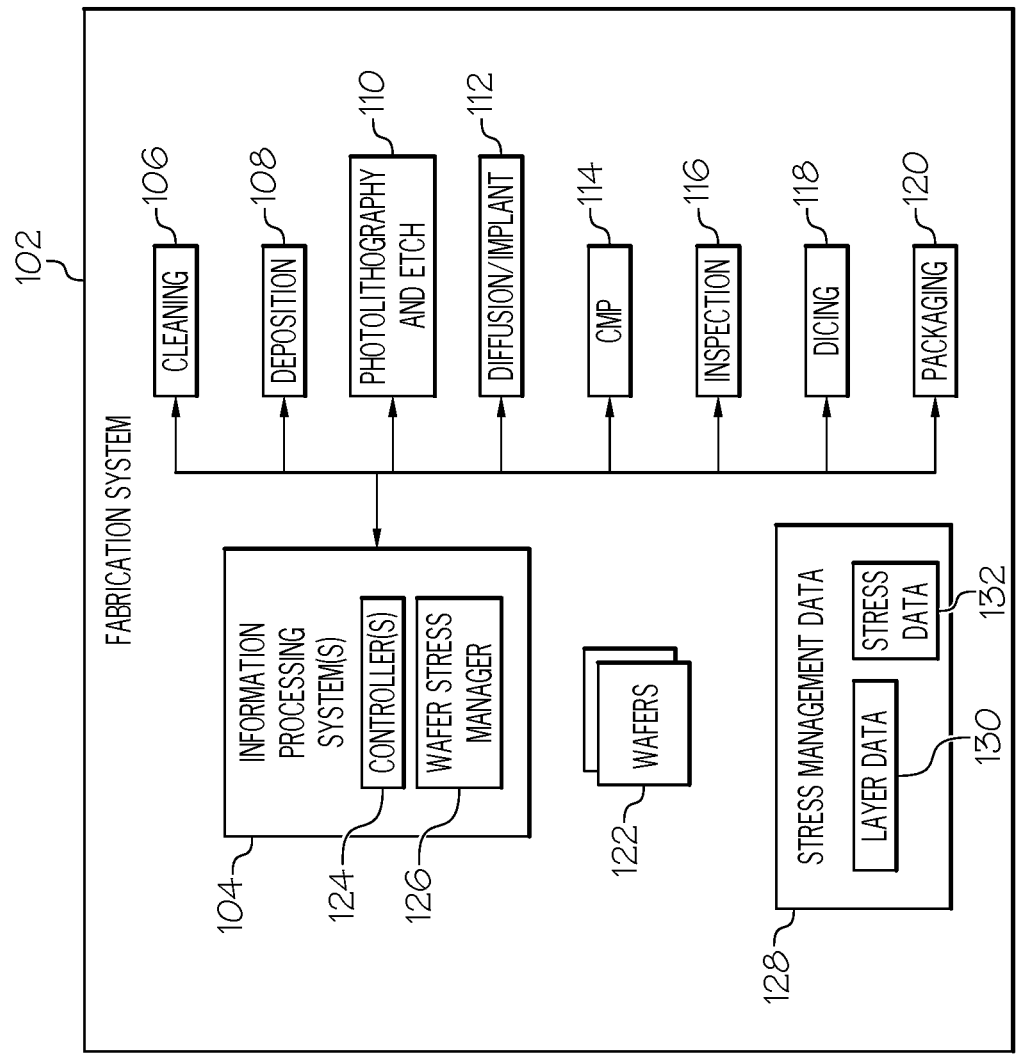
FIG. 1 is a block diagram illustrating a system for fabricating semiconductor devices and managing stress of semiconductor wafers according to one embodiment of the present invention.

Referring now to the drawings in which like numerals represent the same of similar elements, FIG. 1 illustrates a block diagram of an operating environment 100 for managing wafer stress during fabrication of semiconductor device features. In various embodiments, the operating environment 100 comprises a semiconductor fabrication system 102. The semiconductor fabrication system is responsible for the manufacturing and packaging of semiconductor chips. In one embodiment, the semiconductor fabrication system comprises one or more information processing systems 104; fabrication and packaging stations/components 106 to 120; and semiconductor wafers 122.

The one or more fabrication and packaging stations 106 to 120 may include a cleaning station 106, a deposition station 108, a photolithography station 110, a diffusion/implant station 112, a CMP station 114, an inspection station 116, a dicing station 118, a packaging station 120, and/or the like. The information processing system 104 controls the one or more fabrication/packaging stations and their components. In one embodiment, the information processing system 104 may comprise at least one controller 124 and a wafer stress manager 126. Each of these components may be part of one or more processors or may be a component that is separate and distinct from the processor(s) of the information processing system 104. The information processing system 104, in one embodiment, further comprises stress management data 128 such as stress film/layer data 130 (e.g., layer identifiers, layer stress, layer area/size, layer thickness, etc.) and wafer stress measurement data 132. The stress management data 128 may be stored within memory/storage of the information processing system 104, on a remote information processing system, and/or on a remote storage device.

In one example, fabrication of semiconductor device features on the front side of the wafer 122 begins after the wafer 122 has been inspected for any defects. After the wafer 122 has been inspected, the wafer 122 is processed by the cleaning station 106. The cleaning station 106 removes any contaminants from the surface of the wafer 122 using, for example, a wet chemical treatment. Then, the wafer 122 is processed by the deposition station 108. The deposition station 108 deposits, grows, and/or transfers one or more layers of various materials onto the wafer using processes such as chemical vapor deposition (CVD), physical vapor deposition (PVD), atomic layer deposition (ALD), and/or the like.

After the desired materials have been deposited the wafer 122 is processed by the photolithography and etching station 110. For example, the wafer 122 may be cleaned and prepared by removing any unwanted moisture from the surface of the wafer 122. An adhesion promoter may also be applied to the surface of the wafer 122. A layer of photoresist material is then formed on the surface of wafer 122 (or the adhesion promoter layer if formed). A process such as, but not limited to, spin coating may be used to form the photoresist layer. Excess photoresist solvent may be removed by pre-baking the coated semiconductor wafer 122. The photoresist coated wafer 122 is then exposed to one or more patterns of light. The patterns may be formed by projecting the light through a photomask (also referred to herein as "mask") created for the current layer. In some embodiments, the patterns may be formed using a maskless process.

The bright parts of the image pattern cause chemical reactions, which result in one of the following situations depending on the type of resist material being used. Exposed positive-tone resist material becomes more soluble so that it may be dissolved in a developer liquid, and the dark portions of the image remain insoluble. Exposed negative-tone resist material becomes less soluble so that it may not be dissolved in a developer liquid, and the dark portions of the image remain soluble.

A post exposure bake (PEB) process may be performed that subjects the wafer 122 to heat for a given period of time after the exposure process. The PEB performs and completes the exposure reaction. The PEB process may also reduce mechanical stress formed during the exposure process. The wafer 122 is then subjected to one or more develop solutions after the post exposure bake. The develop solution(s) dissolves away the exposed portions of the photoresist. After development, the remaining photoresist forms a stenciled pattern across the wafer surface, which accurately matches the desired design pattern. An etching process is then performed that subjects the wafer 122 to wet or dry chemical agents to remove one or more layers of the wafer 122 not protected by the photoresist pattern. Any remaining photoresist material may then be removed after the etching process using, for example, chemical stripping, ashing, etc. It should be noted that semiconductor fabrication is not limited to the above described process and other fabrication processes are applicable as well.

The photolithographic process results in a layer of patterned semiconductor device features (also referred to as "patterned layers"). After the current layer of features has been patterned, the wafer 122 may be optionally processed by one or diffusion/implant stations 112 to deposit/diffuse or implant dopants into one or more patterned layers. The wafer 122 may also be processed by the CMP station 114 to polish the surface of the patterned layers. After the current layer of features has been patterned, the wafer 122 is processed by one or more defect inspection stations 116. In one embodiment, the defect inspection station 116 inspects the current layer of patterned features for defects and corrects/manages any defects using one or more methods known to those of ordinary skill in the art. It should be noted that the wafer 122 can be inspected at various stages throughout fabrication such as after photoresist deposition, photolithography processing, etching, stripping, diffusion/implanting, and CMP.

Once patterned features have been formed and inspected, the wafer 122 is passed back to the cleaning station 106 if additional fabrication processing is needed. The above described processes are then repeated until all of the desired layers of patterned features have been formed and fabrication of the wafer 122 has been completed. The above process flow (or variations thereof) may be utilized for frontend-of-the line (FEOL) processing where individual devices are patterned; middle-of-line (MOL) processing where local connections between devices are formed; and backend-of-line (BEOL) processing wherein interconnect structures are formed. When fabrication of the wafer 122 has completed, the wafer 122 is processed by the dicing station 118 to separate the dies from the wafer 122. The packaging station 120 then packages and tests the dies using one or more packaging and testing methods.

As noted above, semiconductor wafers may become warped/bowed (non-planar shape) during fabrication of various features. Warpage may be caused by formation of various features and layers that cause tensile and/or compressive stress on the wafer. For example, the layers formed on the wafer may experience multiple temperature changes during fabrication which causes the layers to expand or contract thereby generating tensile and/or compressive stresses on the wafer. These stresses cause the wafer to deform in or out of plane. A distorted wafer can interfere with downstream processes, such as patterning, etching, CMP, etc. and adversely affect die yield. In addition, a distorted wafer may result in the photolithography station not being able to hold the wafer in place on its chuck. A severely distorted/warped wafer can crack during processing at any station or during transport from one station to another.

Conventional methods of managing wafer warpage typically deposit films/layers having given stress characteristics on the front side of the wafer after specific fabrication processes have completed. However, as devices continue to decrease in thickness adding additional layers to the wafer front side may be undesirable. For example, in conventional methods the film used to tune the wafer bowing is part of the process step. As a result, these methods only address wafer bowing at a particular point in the fabrication process and generally cannot balance the wafer bowing through fabrication.

However, one or more embodiments of the present invention overcome these problems by forming multiple stress layers on the backside of the semiconductor wafer. As fabrication progresses on the front side of the semiconductor wafer, embodiments remove and/or thin portions of a backside stress layer(s) to manage the stress experienced by the wafer on its front side. This allows the stress of the wafer to be tuned such that wafer stress and warpage is able to be kept in neutral throughout the fabrication process without affecting wafer front side processing.

Figure 2:
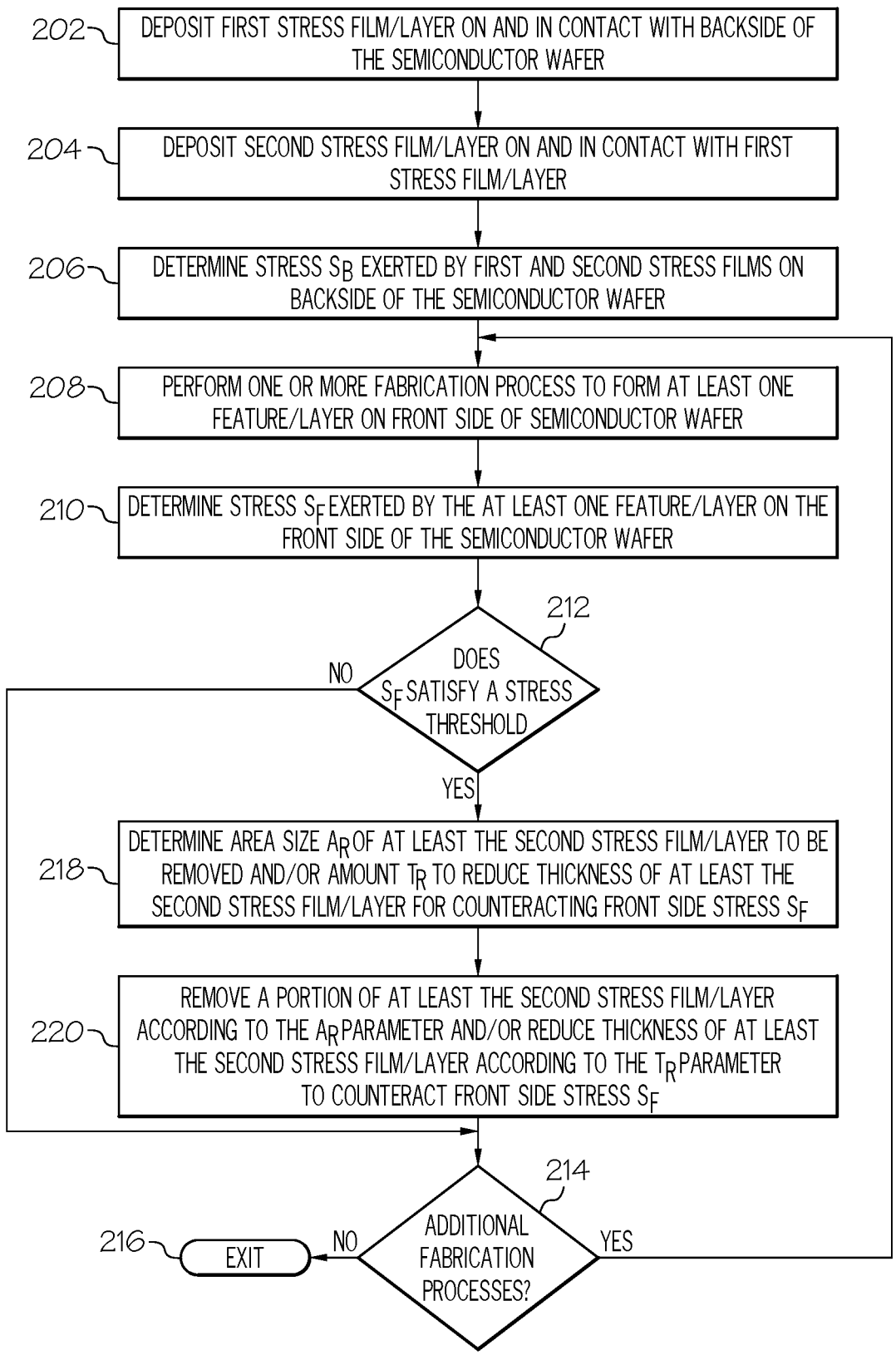
FIG. 2 is an operational flow diagram illustrating an overall process of managing stress of semiconductor wafers according to one embodiment of the present invention.

FIG. 2 is an operational flow diagram illustrating an overall process of managing wafer stress during fabrication of semiconductor components thereon. FIG. 2 will be discussed in combination with FIGS. 3 to 8A, which provide illustrate examples of the one or more steps discussed in FIG. 2. A semiconductor wafer 302 (FIGS. 3 and 3A) comprising a front side 304 and a backside 306 is pre-stressed by depositing a first film/layer 308 on and in contact with the backside 306 of the wafer 302 at step 202. In one embodiment, the first film 308 directly contacts a semiconductor material/layer of the wafer backside 306. However, in another embodiment, the wafer backside 306 may comprise a non-semiconductor material/layer on which the first film 308 is formed in direct contact with. The first film 308, in one embodiment, is deposited prior to any front side processes having been performed on the wafer 302. Various methods may be used to deposit the first film 308 on the backside 306 of the wafer 302. For example, the wafer 302 may be flipped over within the fabrication system 102 and processed by the deposition station 108 for forming the first film 308 on the backside 306 of the wafer 302. Deposition processes such as ALD, plasma enhanced ALD, CVD, plasma enhanced CVD, and/or the like may be used to deposit the first film 308.

In some embodiments, the wafer 302 is a bulk wafer and may be comprises entirely of semiconductor material. For example, the wafer 302 may comprise a single crystalline semiconductor material or a polycrystalline material. In another embodiment, the wafer 302 may include an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor material, or an organic semiconductor material. In other embodiments, the wafer 302 may be formed on and in contact with a handle substrate or an insulating layer disposed in contact with a handle substrate. In this embodiment, the handle substrate includes similar materials to those discussed above. In other embodiments, the wafer 302 may comprise a dielectric layer formed on and in contact with a top surface of the wafer 302. It should be noted that embodiments of the present invention are not limited to these examples and are applicable to wafers comprising single or multiple layers.

The first film 308, in one embodiment, comprises a high tensile stress material such as (but not limited to) a high tensile stress oxide, silicon nitride, or other applicable material, and further comprises a given stress $S_1$, area $A_1$, and thickness $T_1$. One example range of tensile stress $S_1$ exerted on the wafer 302 by the first film 308 is −300 to −500 MPa although other stress forces are applicable as well. It should be noted that a tensile stress exerted on the backside 306 of the wafer 302 is considered a negative (−) force, whereas a tensile tress exerted on the front side 304 of the wafer 302 is considered a positive (+) force. In one example, the initial area $A_1$ of the first film 308 is equal or substantially equal to area of the backside 306 of the wafer 302 although other areas are applicable as well. One example range of film thickness $T_1$ for the first film 308 is between 2 to 4 μm although other thicknesses are applicable as well. The given stress $S_1$, area $A_1$, and thickness $T_1$ as well as the film type, identifier, and/or the like may be stored as part of the layer data 130 within the stress management data 128.

Figure 3:
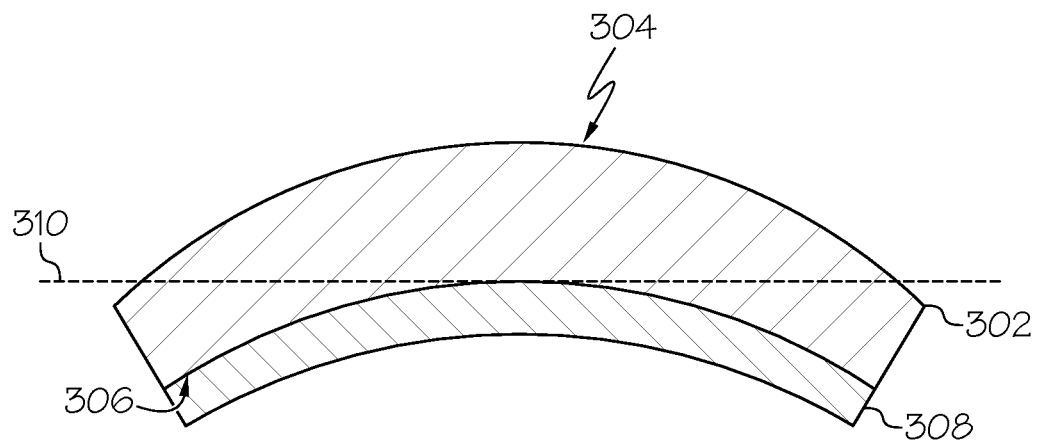
FIG. 3 is a side view of a semiconductor wafer after a first stress film/layer has been formed on the backside of the semiconductor wafer according to one embodiment of the present invention.
Figure 3A:
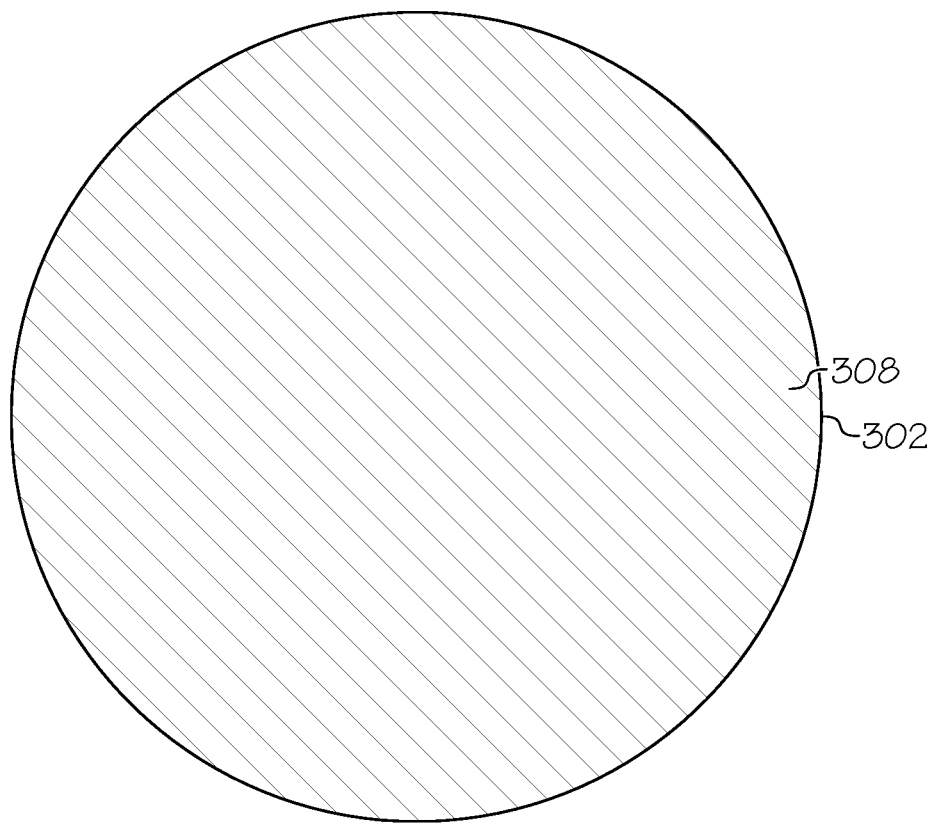
FIG. 3A is top-down view of the semiconductor wafer in FIG. 3 according to one embodiment of the present invention.

FIGS. 3 and 3A show one illustrative example of the wafer 302 after the first film 308 has been deposited on the wafer backside 306. Since the first film 308 in this example comprises a tensile stress and is applied to the wafer backside 306 the film 308 pulls the outer edges of the wafer 302 down (i.e., below the reference plane line 310) and bows the center point 312 of the wafer 302 above the reference plane line 310. It should be noted that FIG. 3 is not drawn to scale and has been exaggerated to illustrate the curvature of the wafer 302.

The process continues to step 204 of FIG. 2 where after the first film 308 has been formed on the wafer backside 306 a second film/layer 402 (FIGS. 4 and 4A) is formed on and in contact with the first film 308. In one embodiment, the second film 402 is formed in direct contact with the first film 308. The second film 402, in one embodiment, is deposited prior to any front side processes having been performed on the wafer 302. Various methods may be used to deposit the first film 308 on the backside 306 of the wafer 302 such as ALD, plasma enhanced ALD, CVD, plasma enhanced CVD, and/or the like may be used to deposit the first film 308.

The second film 402, in one embodiment, comprises a material(s) having an opposing stress (e.g., compressive stress) with respect to the stress (e.g., tensile stress) of the first film 308. Stated differently, the second film 402 exerts a stress that exerts a force on the wafer 302 that opposes the force exerted on the wafer 302 by the stress of the first film 308. For example, if the first film 308 exerts a negative (−MPa) stress/force on the wafer 302, the second film exerts a positive (+MPa) stress/force on the wafer 302. Example materials for the second film 402 include (but not limited to) an oxide, silicon nitride, or other applicable material.

The second film 402 comprises a given stress $S_2$, area $A_2$, and thickness $T_2$. In one embodiment, the stress $S_2$ of the second film 402 is selected so that it effectively cancels out the tensile stress exerted by the first film 308 such that the warp/bow of the wafer 302 returns back to being substantially neutral. One example range of tensile stress $S_2$ exerted on the wafer 302 by the second film 402 is +300 to +500 MPa although other stress forces are applicable as well. It should be noted that a compressive stress exerted on the backside 306 of the wafer 302 is considered a positive (+) force whereas a compressive stress exerted on the front side 304 of the wafer 302 is considered a negative (−) force. In one example, the initial area $A_2$ of the second film 402 is equal or substantially equal to the area $A_1$ of the first film 308 although other areas are applicable as well. One example range of film thickness for the second film 402 is between 2 to 4 μm although other thicknesses are applicable as well. The given stress $S_2$, area $A_2$, and thickness $T_2$ as well as the film type, identifier, and/or the like may be stored as part of the layer data 132 within the stress management data 128. It should be noted that throughout this discussed the first and second films/layers 308, 402 may also be referred to as "the first stress film/layer 308" and "the second stress film/layer 402", respectively, or some variant thereof.

Figure 4:
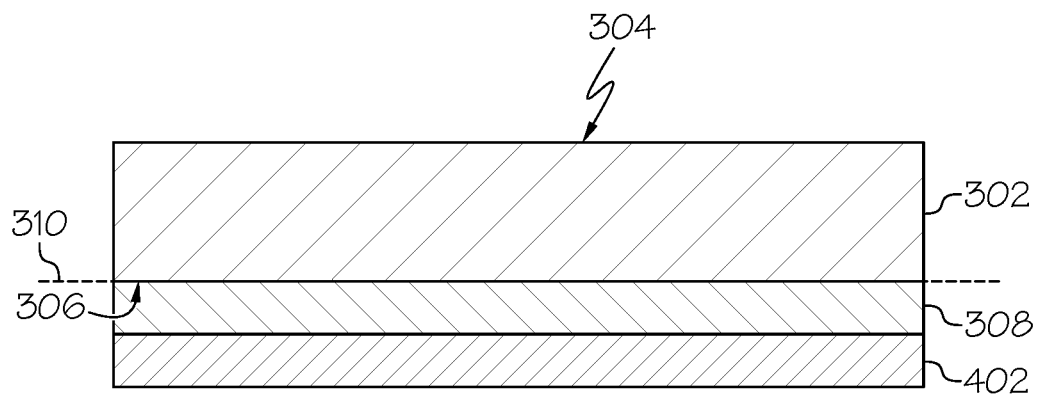
FIG. 4 is a side view of the semiconductor wafer after a second stress film/layer has been formed on the first stress film/layer according to one embodiment of the present invention.
Figure 4A:
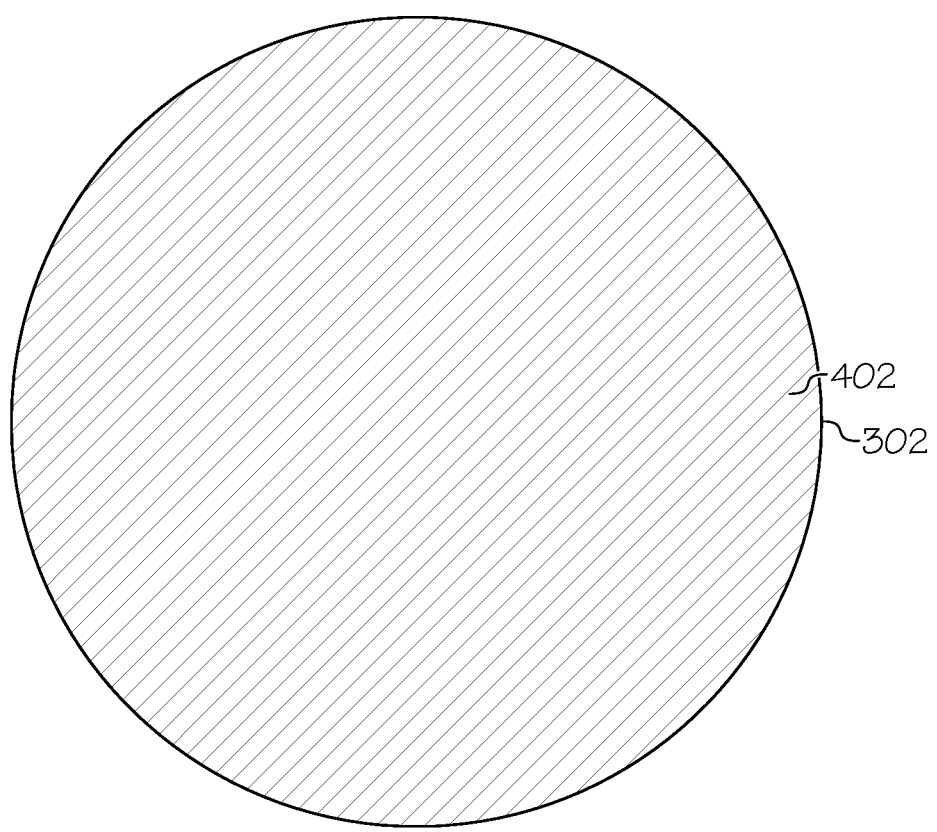
FIG. 4A is bottom view of the semiconductor wafer in FIG. 4 according to one embodiment of the present invention.

FIGS. 4 and 4A show one example of the wafer 302 after the second film 402 has been deposited on the wafer backside 306. Since the compressive stress $S_2$ of the second film 402, in one embodiment, is selected to effectively cancel out the tensile stress $S_1$ exerted on the wafer 302 by the first film 308, the warp/bow of the wafer 302 returns back to a substantially neutral position. It should be noted that embodiments of the present invention are not limited to first depositing a high tensile stress film 308 then a compressive stress film 402. For example, a compressive stress film 402 can be deposited first and then high tensile stress film 308 can be deposited on and in contact with the compressive stress film 402. In addition, embodiments of the present invention are not limited to forming only two films 308, 402 on the backside 306 of the wafer 302. For example, multiple high tensile stress films and/or multiple compressive stress films may be deposited on the backside of the wafer 30 in various configurations. Also, in one or more embodiments, the multiple stress films 308, 402 are applied to the backside 306 of the wafer 302 after one or more fabrication processes have completed. For example, the stress films 308, 402 can be applied after (or during) FOL and/or MOL processing has completed.

Returning now to FIG. 2, after at least the second stress film 402 has been deposited in contact with the first stress film 308 on the wafer backside 306, the wafer 302 is processed at step 206 by one or more of the inspection stations 116 to measure the wafer's initial stress $S_B$ exerted by the backside stress films 308, 402. For example, a laser may be utilized to measure the radius of curvature and bow of the wafer 302. The laser beam is reflected at an angle that corresponds to the radius of curvature of the wafer 302. The stress being exerted on the wafer 302 by the backside films 308, 402 can be calculated from the difference in radius of curvature (i.e., wafer bow) measure before and after film deposition. In one embodiment, the initial stress $S_B$ is 0 MPa or substantially close to 0 MPa since the backside stress films 308, 402 substantially cancel each other out. However, the backside stress films 308, 402 can be configured such that a given amount of stress above or below 0 MPa is measured. In one embodiment, these measurements are stored as part of the stress data 130 within the stress management data 128.

After the initial wafer stress measurements have been taken, one or more fabrication processes are performed on the front side 304 of the wafer 302 at step 208 utilizing the various stations 106 to 120 of the fabrication system 102. These processes may include FEOL processes such as patterning of individual devices (e.g., transistors, capacitors, memory cells, etc.); MOL processes such as forming local electrical connections between devices; BEOL processes that form a metallization layer that is interconnected with the individual devices; or a combination thereof.

Figure 5:
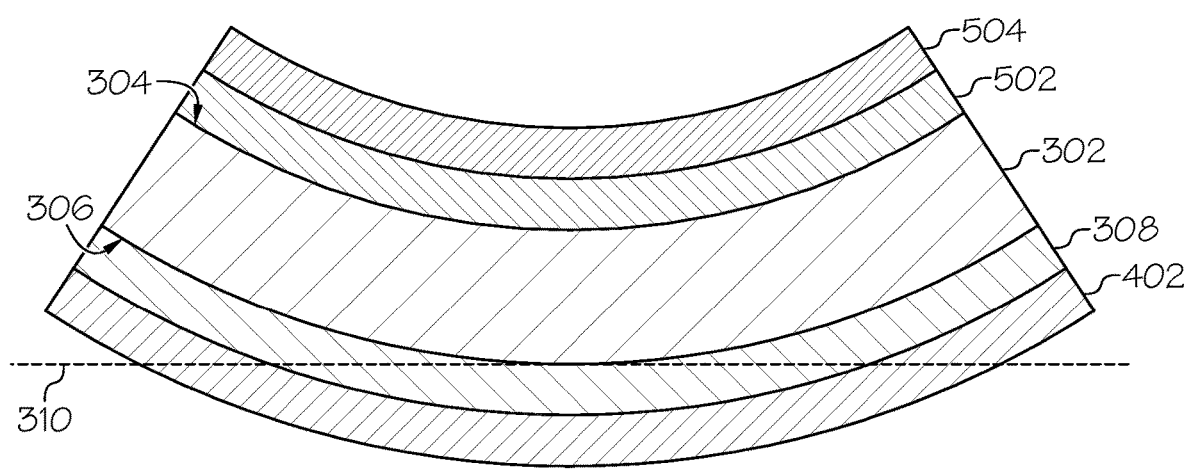
FIG. 5 is a side view of the semiconductor wafer after one or more features have been formed on the front side of the semiconductor wafer causing the wafer to warp according to one embodiment of the present invention.

As layers of materials are deposited and/or features are patterned on the front side 304 of the wafer 302, tensile and/or compressive stress forces are exerted on the wafer 302 as discussed above. For example, FIG. 5 shows the wafer 302 after one or more semiconductor device layers/features 502, 504 have been formed on the front side 304 of the wafer 302. As can be seen, the layers/features 502, 504 have exerted stress on the wafer 302 causing the wafer 302 to warp/bow.

Therefore, in one embodiment, after a given number of layers/features are formed the wafer stress manager 126 determines the current stress $S_F$ being exerted on the wafer 302 by the front side layers/features 502, 504 as shown in step 210 of FIG. 2. In one embodiment, this stress is determined utilizing one or more of the inspection stations 116 similar to that discussed above with respect to the initial backside stress $S_B$ of the wafer 302. For example, a laser can be utilized to measure the radius of curvature and bow of the wafer 302. The laser beam is reflected at an angle that corresponds to the radius of curvature of the wafer 302. The stress being exerted on the wafer 302 by the front side features 502, 504 can be calculated from the difference in radius of curvature (i.e., wafer bow) measure before and after film deposition. For example, the current stress $S_F$ being exerted by the front side layers/features 502, 504 can be calculated based on the difference in radius of curvature measured for the initial backside stress $S_B$ and the current measured radius of curvature. The determined current stress $S_F$ may then be stored as part of the stress data 132 within the stress management data 128.

The wafer stress manager 126 then determines if the current stress $S_F$ being exerted on the wafer satisfies a given stress threshold (e.g., +100 MPa) at step 212. In some embodiments, the stress threshold is set to a given stress value that will cause the wafer to bow/warp to a point where subsequent fabrication process are negatively affected. If the determination at step 212 is negative, the wafer stress manager 126 further determines at step 214 whether there are additional fabrication processes to be performed for which wafer stress is to be managed. If there are no additional fabrication processes, then the control flow exits at step 216. However, if additional fabrication processes still need to be performed the operational flow returns to step 208 where one or more additional fabrication processes are performed on the front side 304 of the wafer 302 and the processes discussed above with respect to 210 and 212 are repeated. It should be noted that, in some embodiments, instead of determining if the current stress $S_F$ satisfies the given stress threshold the wafer stress manager 126 determines if the current stress $S_F$ fails to satisfy the given stress threshold.

If the wafer stress manager 126 determines at step 212 that the current stress $S_F$ satisfies the stress threshold (e.g., $S_F > +100$ MPa) the control flows to step 218 where the wafer stress manager 126 performs a first operation that determines an area size of one or more backside stress films 308, 402 to remove and/or performs a second operation that determines an amount to reduce the thickness of one or more of the backside stress films 308, 402 for counteracting the measured/determined front side stress $S_F$. In some embodiments, the wafer stress manager 126 is pre-configured to select either or both of these stress management operations globally for all wafers or on a per wafer basis. In addition, the stress management data 128 may comprise instructions that are read/executed by the wafer stress manager 126 for configuring the wafer stress manager 126 to perform either or both of the stress management operations discussed above.

However, in one embodiment, the wafer stress manager 126 is further configured to predict/determine whether one or more additional front side features that are to be subsequently fabricated will balance out the stress being exerted by the current front side features 502, 504 or least bring this stress below the stress threshold. For example, the wafer stress manager 126 is able to access fabrication data that comprises, among other things, various characteristics and parameters associated with features/layers to be fabricated on the wafer 302. Based on these characteristics and parameters such as material, size (e.g., thickness, area, etc.), and/or the like the wafer stress manager 126 is able to determine the stress to be exerted on the wafer 302 by these features/layers. In some embodiments, the estimated stress of a given feature/layer to be subsequently fabricated may already be stored in the fabrication data and accessible to the wafer stress manager 126. The wafer stress manager 126 compares this estimated stress to the current front side stress $S_F$ and the stress threshold to at least determine if the front side stress $S_F$ will be below the stress threshold after the one or more features/layers are fabricated. If this determination is positive, processing may return to step 208 where the one or more features/layers are fabricated. However, if this determination is negative processing continues to steps 218 and 220 where the wafer stress manager 126 performs either or both of the stress management operations discussed above.

Regarding the first wafer stress management operation, the wafer stress manager 126 is able to determine an area size $A_R$ of the one or more backside stress film(s) 308, 402 to remove for counteracting the front side stress $S_F$ in one or more ways. For example, the following equation may be utilized by the wafer stress manager 126 to determine the amount (area) of at least the second stress film 402 to be removed:

$$A_R = A_2 \times \left(\frac{S_F - S_B}{S_2}\right) \quad \text{(EQ 1)}$$

where $A_R$ is the area size to be removed; $A_2$ is the current area of the second stress film/layer 402; $S_F$ is the current stress exerted by the front side layers/features; $S_B$ is the current stress exerted being exerted on the wafer backside 306 by the first and second stress film 308, 402 in their current state; and $S_2$ is the current stress exerted by the second stress film/layer 402 on the wafer backside 306.

Regarding the second wafer stress management operation, the wafer stress manager 126 is able to determine an amount $T_R$ to reduce the thickness of the one or more backside stress film(s) 308, 402 to remove for counteracting the front side stress $S_F$ in one or more ways. For example, the following equation may be utilized by the wafer stress manager 126 to determine an amount $T_R$ to reduce the thickness of at least the second stress film 402:

$$T_R = T_2 \times \left(\frac{S_F}{S_2}\right) \quad \text{(EQ 2)}$$

where $T_R$ is the amount (e.g., in nanometers) manager 126 to reduce the thickness of the second stress film 402; $T_2$ is the current thickness of the second stress film/layer 402; $S_F$ is the current stress exerted by the front side layers/features; and $S_2$ is the current stress exerted by the second stress film/layer 402 on the wafer backside 306.

The determined/calculated area size $A_R$ and/or thickness reduction $T_R$ parameters may be stored by the wafer stress manager 126 as part of the wafer stress management data 128. Once the area size $A_R$ and/or thickness reduction $T_R$ have been determined, the wafer stress manager 126 may program one or more of the fabrication processing stations 106 to 120 based on these and other parameters. The wafer 302, at step 220, is then processed by the programmed processing station(s) such as the etching station 112 and/or the CMP station 114 to remove an area and/or reduce the thickness of the backside stress film(s) 308, 402 according to the determined area size $A_R$ and/or thickness reduction $T_R$ parameters.

Figure 6:
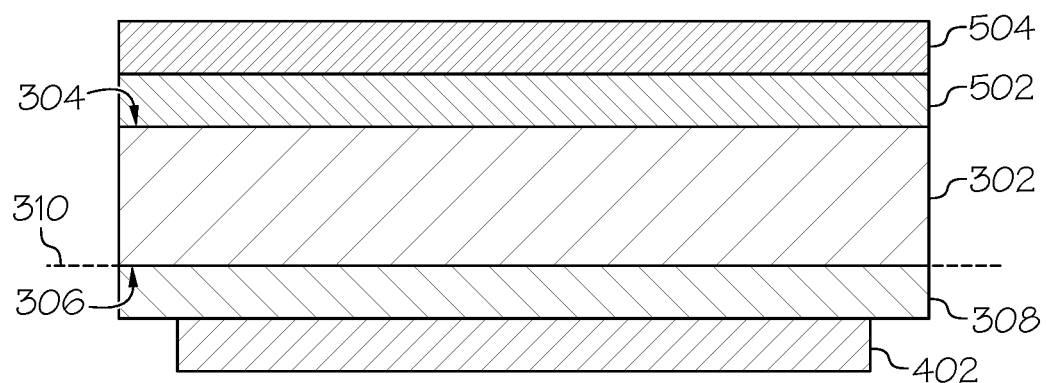
FIG. 6 is a side view of the semiconductor wafer after a portion of the second stress film/layer has been etched away to counteract the stress exerted by the one or more features formed on the front side of the semiconductor wafer according to one embodiment of the present invention.
Figure 6A:
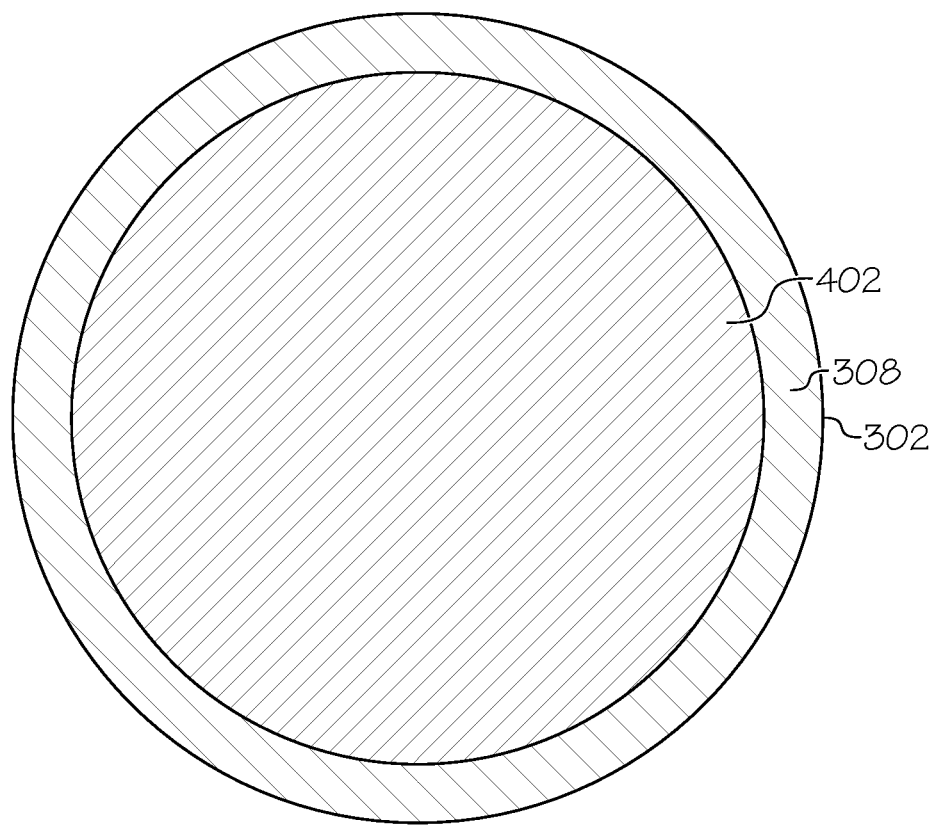
FIG. 6A is a bottom view of the semiconductor wafer in FIG. 6 according one embodiment of the present invention.
Figure 7:
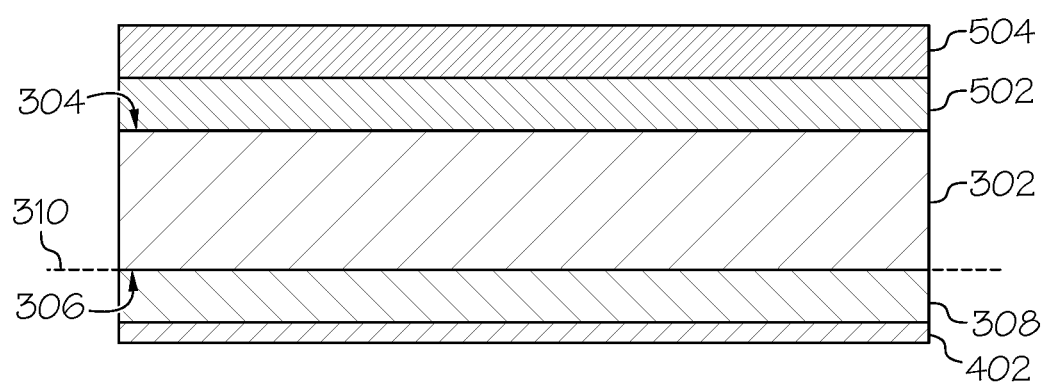
FIG. 7 is a side view of the semiconductor wafer after the thickness of the second stress film/layer has been reduced to counteract the stress exerted by the one or more features formed on the front side of the semiconductor wafer according to another embodiment of the present invention.

For example, FIGS. 6 and 6A show one illustrative example of the wafer 302 after processing by one or more processing stations 106 to 120 to remove a portion of the second backside stress film 402. Typical lithographic and etching process (e.g., dry etch RIE) may be utilized to mask off portions of the second backside stress film 402 and to etch away exposed portions of the second backside stress film 402. The etching process stops on the first backside stress film 308 and also exposes a portion 602 of the first backside stress film 308. FIG. 7 shows another illustrative example of the wafer 302 after processing by one or more processing stations 106 to 120 to reduce the thickness of the second backside stress film 402. An etching process such as a dry etch may be utilized to reduce the thickness of the second backside stress film 402.

The partial removal and/or thinning of the second backside stress film 402 as shown in FIGS. 6 to 7 reduces the amount of stress exerted by the second backside stress film 402 on the wafer 302. This reduction in backside stress counteracts the front side stress thereby keeping the wafer stress and warpage substantially neutral or tuned to a desired level. For example, consider a scenario where the front side layers/features 502, 504 exert a tensile front side stress of $S_F$=+50 MPa and the combined stress $S_B$ of the first stress film 308 (−500 MPa) and the second stress film 402 (+500 MPa) is 0 MPa. In this example, the wafer stress manager 126 determines/calculates the $A_R$ value and/or the $T_R$ value such that the backside stress $S_B$ is adjusted from 0 MPa to −50 MPa to counteract the +50 MPa front side stress.

After the wafer stress manager 126 determines the corresponding $A_R$ and/or $T_R$ values, the area and/or thickness of the second backside stress film 402 is then reduced by the corresponding $A_R$ and/or $T_R$ values at step 220. In one embodiment, since less of the second backside stress film 402 remains after etching/polishing thereof it exerts less stress on the wafer 302 thereby increasing the effect of the stress exerted by the first backside film 308. For example, if the current stress $S_1$ of the first backside film 308 is −500 MPa and the current stress $S_2$ of the second backside film 402 is +500 MPa then etching/polishing the second film 402 to reduce its stress from +500 to +450 MPa effectively increases the negative stress exerted by the first backside film 308 50 MPa→(−500 MPa)+(+450 MPa)=−50 MPa. This increased negative −50 MPa stress counteracts the positive +50 MPa stress exerted by the front side layers/features 502, 504 such that the wafer effectively experiences zero to substantially zero stress and returns the wafer distortion (e.g., warp/bow) back to a substantially neutral position with respect to the reference line 310. If additional processing steps still remain the control flow returns to step 208. However, if additional processing steps do not remain the control flow exits.

It should be noted that in addition to utilizing the method discussed above to measure the stress of the wafer 302, the wafer stress manager 126 can also determine wafer stress based on color contrast between at least the backside films 308, 402. For example, the backside films 308, 402 exhibit different colors as a function of their thickness due characteristics of light diffraction. An ellipsometer or other device can be utilized at known angles and wavelengths to measure the polarization of light reflected back to the sensor to determine the film thickness. The wafer stress manager 126 is able to determine/calculate the stress based on the film thickness of the backside films 308, 402.

It should also be noted that embodiments of the present invention are not limited to removing an area and/or thinning the second backside stress film 402. In particular, there may be some instances where the stress $S_2$ of the second backside film 402 and the front side stress of $S_F$ exert are the same type (e.g., either compressive or tensile). In an example where the $S_2$ stress and the $S_F$ stress are compressive, the $S_2$ stress is a positive stress and the $S_F$ stress is a negative stress. Accordingly, removing/thinning a portion of the second backside film 402 reduces the positive stress being exerted by the second backside film 402 and increases the negative stress being exerted on the wafer 302 by the first backside film 308. Stated differently, the negative stress exerted on the wafer 302 by the front side features is increased instead of being counteracted by the backside films 308, 402. For example, consider one example where the first backside film stress $S_1$ stress −500 MPa stress, the second backside film stress $S_2$ stress +500 MPa stress, and the front side stress $S_F$ stress −200 MPa. If a portion of the second backside film 402 is removed/thinned such that its stress is reduced to +450 MPa, which effectively increases the negative stress exerted on the wafer by the first backside film 408 and the frons side features 502, 504 by 50 MPa.

Therefore, in one embodiment, instead of determining an area $A_R$ of the second backside film 402 to remove or an amount $T_R$ to reduce its thickness the wafer stress manager 126 determines an amount to increase the thickness of the second backside film 402. This determination may be based on a derivation of EQ 1 and/or EQ 2 discussed above and/or other applicable calculations. By increasing the thickness of the second backside film 402 (or adding another similar stress layer) the positive stress exerted on the backside 306 of the wafer 302 is increased thereby counteracting the front side negative stress. In the example above, the first backside film 308 had a stress $S_1$ of −500 MPa stress, the second backside film 408 had a stress $S_2$ of +500 MPa stress, and the front side had a stress $S_F$ of −200 MPa where the total negative stress ($S_2+S_F$) exerted on the wafer 302 is −700 MPa. Therefore, in this example, the wafer stress manager 126 configures the fabrication processing system 102 to increase the thickness of the second backside film 408 such that the current stress $S_2$ (+500 MPa) of the second backside film 408 is increase by +200 MPa to balance the negative stress or at least enough to effectively lower the negative stress below the stress threshold.

The process flow is the same as discussed above with respect to FIG. 2 except when the wafer stress manager makes its determination at step 218 it determines an amount to increase the thickness of the second backside film 402 at step 218. The wafer 302 would then be processed by one or more of the processing stations 106 to 120 to add additional material to the second backside film 402.

One advantage of the present invention is that one or more of the backside stress films 308, 402 can be gradually etched away and/or thinned at any point of the fabrication process. This allows the stress of the wafer 302 to be fined tuned throughout the fabrication process such that the stress is maintained at a desired level (e.g., 0 or neutral stress). The backside stress films 308, 402 can be gradually etched away, thinned, and/or added to without affecting the front side processing.

Figure 8:
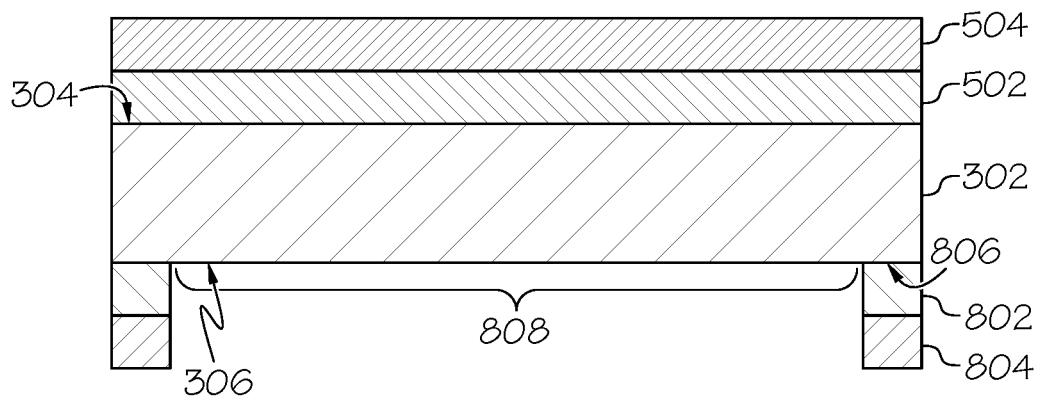
FIG. 8 is a side view of the semiconductor wafer after one or more stress films/layers have been formed only on and circumscribing the outer edge/bevel of the semiconductor wafer according one embodiment of the present invention.
Figure 8A:
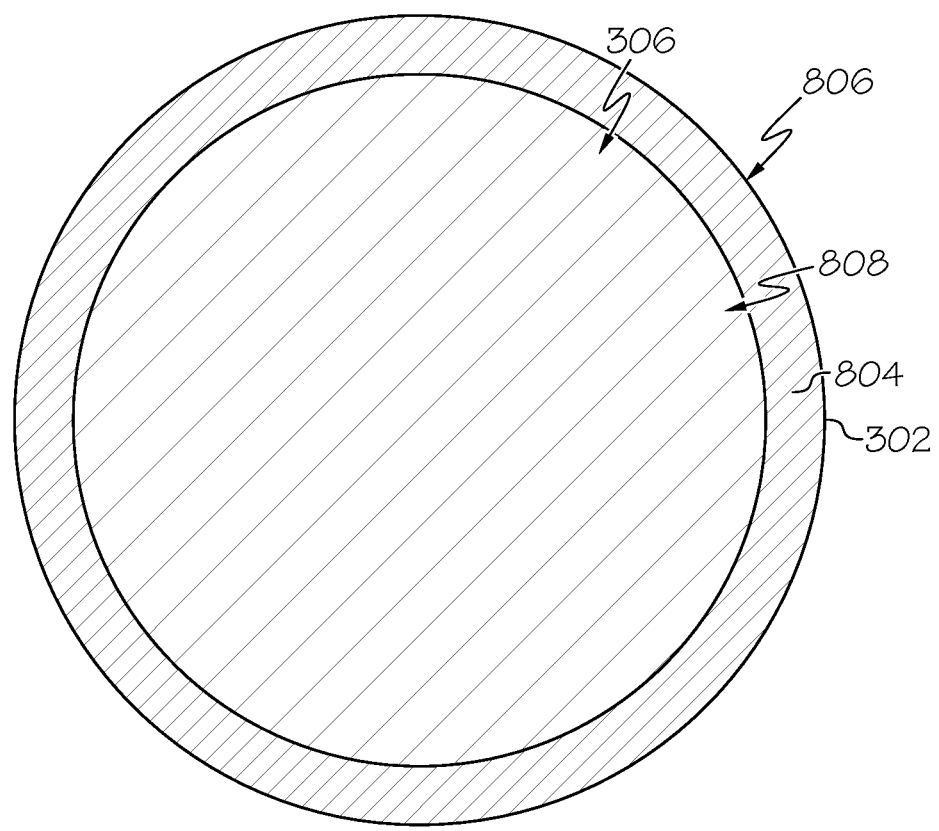
FIG. 8A is bottom view of the semiconductor wafer in FIG. 8 according one embodiment of the present invention.

It should be noted that embodiments of the present invention are not limited to forming the backside stress films 308, 402 over the entire backside 306 of the wafer 302. For example, FIGS. 8 and 8A illustrate another embodiment where one or more backside stress films 802, 804 are formed only on the outer edge/bevel 806 of the wafer backside 306. In this embodiment, a first film/layer 802 is formed in contact with and circumscribing the outer edge/bevel 806 of the wafer backside 306. An optional second film/layer 804 is then formed in contact with and circumscribing the first film/layer 802. It should be noted that this process may be repeated to form additional films/layers as well. A portion 808 of the wafer backside 306 that is surrounded by the backside stress layers 802, 804 remains exposed. This configuration is advantageous for through-silicon via (TSV) processing where a via passes completely through the semiconductor wafer 302. Since the backside stress films 802, 804 are only formed on the wafer bevel they do not interfere with the via formed through the exposed portion 306 of the wafer backside 306. This allows for various features to be fabricated on the backside of the wafer such as (but not limited to) TSVs, contacts, and/or the like.

In one embodiment, the backside stress layers 802, 804 are formed similar to the backside stress layers 308, 402 discussed above with respect to FIGS. 3 and 4. However, a shutter may be utilized during the deposition process to block the portion 808 of the wafer backside 306 while maintaining the outer edge/bevel 806 of the wafer backside 306 exposed resulting in the configuration shown in FIGS. 8 and 8A. In addition, the backside stress layers 802, 804 may be gradually etched and/or thinned to manage wafer stress similar to that discussed above with respect to FIGS. 6 to 7. In an embodiment where the first and/or second backside stress layer(s) 802, 804 are gradually etched, the etch may start at the outer edge of the layer(s) 802, 804 and move in a direction toward the center of the wafer 302. Alternatively, the etch may start at the inner edge of the layer(s) 802, 804 and move in a direction toward the outer edge of the wafer 302.

Figure 9:
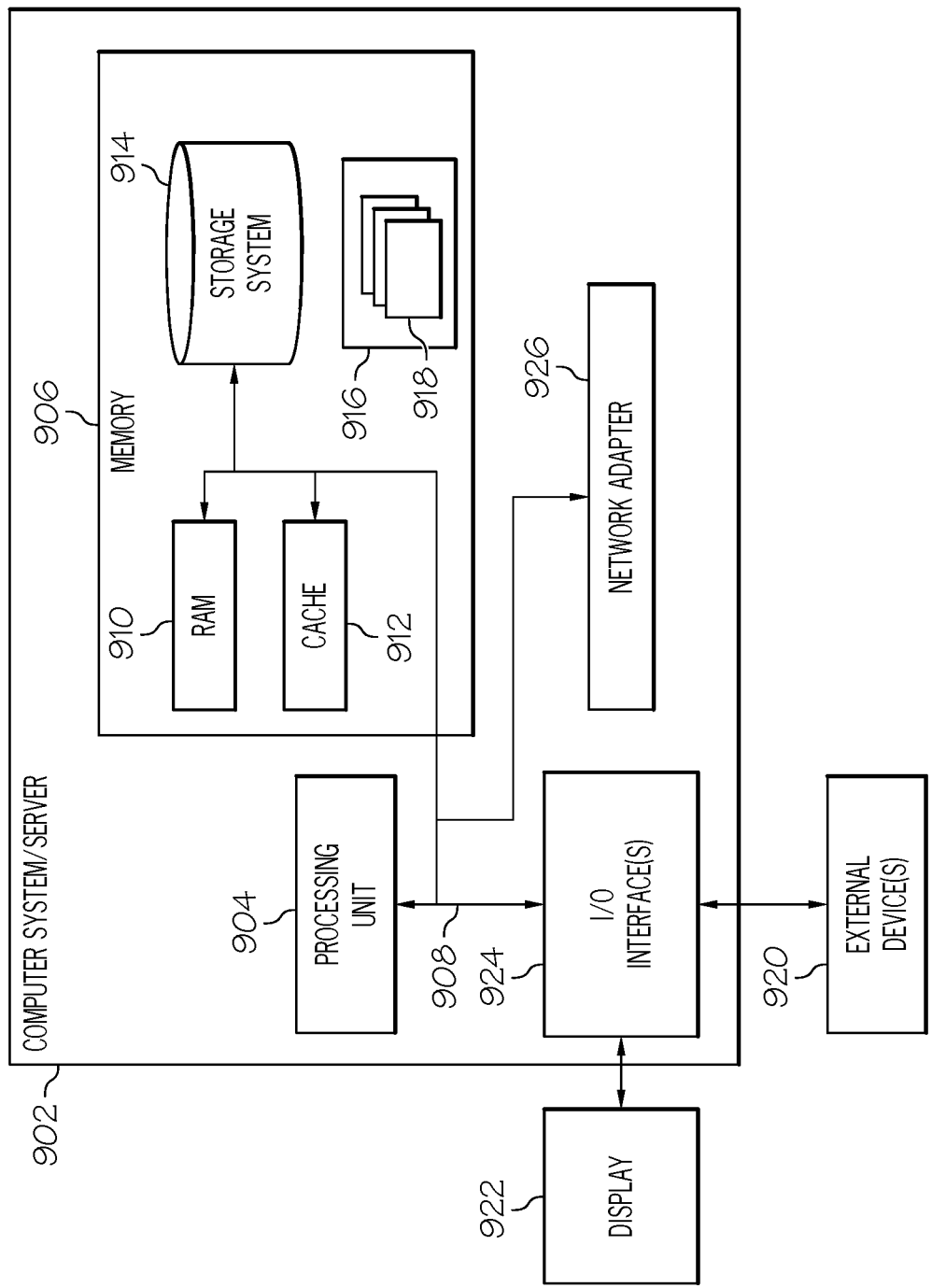
FIG. 9 is a block diagram illustrating one example of an information processing system according to one embodiment of the present invention.

FIG. 9 shows one example of a block diagram illustrating an information processing system 902 that may be utilized in embodiments of the present invention. The information processing system 902 may be based upon a suitably configured processing system configured to implement one or more embodiments of the present invention such as the information processing system 104 of FIG. 1.

Any suitably configured processing system may be used as the information processing system 902 in embodiments of the present invention. The components of the information processing system 902 may include, but are not limited to, one or more processors or processing units 904, a system memory 906, and a bus 908 that couples various system components including the system memory 906 to the processor 904. The bus 908 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Although not shown in FIG. 9, the main memory 906 may include the stress management data 128 discussed above with respect to FIG. 1. The system memory 906 may also include computer system readable media in the form of volatile memory, such as random access memory (RAM) 910 and/or cache memory 912. The information processing system 902 may further include other removable/non-removable, volatile/non-volatile computer system storage media. By way of example only, a storage system 914 may be provided for reading from and writing to a non-removable or removable, non-volatile media such as one or more solid state disks and/or magnetic media (typically called a "hard drive"). A magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each may be connected to the bus 908 by one or more data media interfaces. The memory 906 may include at least one program product having a set of program modules that are configured to carry out the functions of an embodiment of the present invention.

Program/utility 916, having a set of program modules 918, may be stored in memory 906 by way of example, and not limitation, as well as an operating system, one or more application programs, other program modules, and program data. Each of the operating system, one or more application programs, other program modules, and program data or some combination thereof, may include an implementation of a networking environment. Program modules 918 generally carry out the functions and/or methodologies of embodiments of the present invention.

The information processing system 902 may also communicate with one or more external devices 920 such as a keyboard, a pointing device, a display 922, etc.; one or more devices that enable a user to interact with the information processing system 902; and/or any devices (e.g., network card, modem, etc.) that enable computer system/server 902 to communicate with one or more other computing devices. Such communication may occur via I/O interfaces 924. Still yet, the information processing system 902 can communicate with one or more networks such as a local area network (LAN), a general wide area network (WAN), and/or a public network (e.g., the Internet) via network adapter 926. As depicted, the network adapter 926 communicates with the other components of information processing system 902 via the bus 908. Other hardware and/or software components can also be used in conjunction with the information processing system 902. Examples include, but are not limited to: microcode, device drivers, redundant processing units, external disk drive arrays, RAID systems, tape drives, and data archival storage systems.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. The terminology used herein is for the purpose of describing particular embodiments only and is not intended to be limiting of the invention.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

As will be appreciated by one skilled in the art, aspects of the present invention may be embodied as a system, method, or computer program product. Accordingly, various aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Python, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been discussed above with reference to flowchart illustrations and/or block diagrams of methods, apparatus (systems) and computer program products according to various embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Although specific embodiments have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also note that these embodiments are only examples of the many advantageous uses of the innovative teachings herein. In general, statements made in the specification of the present application do not necessarily limit any of the various claimed embodiments. Moreover, some statements may apply to some inventive features but not to others.

What is claimed is:

1. A method for managing semiconductor wafer stress, the method comprising:
    forming a first stress layer on and in contact with a backside of a semiconductor wafer, the first stress layer exerting a first stress on the semiconductor wafer, wherein the backside is opposite to a front side of the semiconductor wafer on which semiconductor device features are fabricated; and
    forming a second stress layer on and in contact with the first stress layer, the second stress layer exerting a second stress on the semiconductor wafer, wherein the first stress and the second stress form a backside stress on the semiconductor wafer, and where the second stress is opposite to the first stress,
    wherein the first stress layer and the second stress layer are formed prior to features being fabricated on the front side of the semiconductor wafer to read opposite to the first stress,
    determining that a front side stress exceeds a stress threshold;
    in response to the front side stress exceeding the stress threshold, determining an amount to adjust the backside stress to counteract the front side stress; and
    adjusting the backside stress based on the determined amount thereby counteracting the front side stress,
    wherein the first stress layer and the second stress layer are formed prior to features being fabricated on the front side of the semiconductor wafer.

2. The method of claim 1, further comprising:
    determining that one or more features have been formed on the front side of the semiconductor wafer; and
    determining the front side stress exerted on the semiconductor wafer by the one or more features.

3. The method of claim 1, wherein adjusting the backside stress comprises:
    removing a given area of the second stress layer, wherein the removing exposes a corresponding portion of the first stress layer.

4. The method of claim 1, wherein adjusting the backside stress comprises:
    reducing a thickness of the second stress layer by a given amount.

5. The method of claim 1, wherein forming the first stress layer comprises:
    forming the first stress layer on and in contact with the backside of the semiconductor wafer in its entirety.

6. The method of claim 1, wherein forming the first stress layer comprises:
    forming the first stress layer only on and circumscribing an outer edge of the semiconductor wafer.

7. A method for managing semiconductor wafer stress, the method comprising:

forming a first stress layer on and in contact with a backside of a semiconductor wafer, the first stress layer exerting a first stress on the semiconductor wafer;

forming a second stress layer on and in contact with the first stress layer, the second stress layer exerting a second stress on the semiconductor wafer, and wherein the second stress is opposite to the first stress;

forming one or more features on a front side of the semiconductor wafer;

determining a front side stress exerted on the semiconductor wafer by the one or more features;

comparing the front side stress to a stress threshold;

in response to the front side stress satisfying the stress threshold, counteracting the front side stress by at least one of removing or thinning a portion of at least the second stress layer; and in response to the front side stress failing to satisfy the stress threshold, maintaining the first stress layer and the second stress layer in their current state.

8. The method of claim 7, further comprising:

forming one or more additional features on the front side of the semiconductor wafer;

determining an additional front side stress exerted on the semiconductor wafer by the one or more additional features;

comparing the additional front side stress to the stress threshold;

in response to the additional front side stress satisfying the stress threshold, counteracting the additional front side stress by at least one of removing or thinning another portion of at least the second stress layer; and in response to the additional front side stress failing to satisfy the stress threshold, maintaining the first stress layer and the second stress layer in their current state.

9. The method of claim 7, wherein the first stress layer and the second stress layer are formed prior to features being fabricated on the front side of the semiconductor wafer.

10. The method of claim 7, wherein forming the first stress layer comprises:

forming the first stress layer on and in contact with the backside of the semiconductor wafer in its entirety.

11. The method of claim 7, wherein forming the first stress layer comprises:

forming the first stress layer only on and circumscribing an outer edge of the semiconductor wafer.

12. The method of claim 7, wherein forming the first stress layer comprises depositing a tensile stress material on and in contact with the backside of the semiconductor wafer, and wherein forming the second stress layer comprises depositing a compressive stress material on and in contact with the first stress layer.

13. A semiconductor structure comprising:

a semiconductor wafer;

a first stress layer disposed on and in contact with a backside of the semiconductor wafer, the first stress layer exerting a first stress on the semiconductor wafer, wherein the backside is opposite to a front side of the semiconductor wafer on which semiconductor device features are fabricated;

a second stress layer on and in contact with the first stress layer, the second stress layer exerting a second stress on the semiconductor wafer, wherein the first stress and the second stress form a backside stress on the semiconductor wafer, and where the second stress is opposite to the first stress, wherein the first stress layer is disposed only on and around an outer edge of the semiconductor wafer, and wherein the second stress layer is disposed only on and in contact with the first stress layer and conforming to the first stress layer; and one or more semiconductor features fabricated on the front side of the semiconductor wafer.

14. The semiconductor structure of claim 13, wherein the first stress is a tensile stress and the second stress is a compressive stress.

15. The semiconductor structure of claim 13, wherein the first stress is a compressive stress and the second stress is a tensile stress.

* * * * *